(12) United States Patent
Antonaia et al.

(10) Patent No.: US 9,469,896 B2
(45) Date of Patent: Oct. 18, 2016

(54) SOLAR SELECTIVE ABSORBER BASED ON DOUBLE NITRIDE COMPOSITE MATERIAL AND PROCESS FOR ITS PREPARATION

(75) Inventors: Alessandro Antonaia, Portici (IT); Salvatore Esposito, Naples (IT); Maria Luisa Addonizio, Portici (IT); Antonio Guglielmo, Sapri (IT)

(73) Assignee: AGENZIA NAZIONALE PER LE NUOVE TECNOLOGIE, L'ENERGIA E LO SVILUPPO ECONOMICO SOSTENIBILE (ENEA), Rome (IT)

( * ) Notice: Subject to any disclaimer, the term of this patent is extended or adjusted under 35 U.S.C. 154(b) by 514 days.

(21) Appl. No.: 14/126,849

(22) PCT Filed: Jun. 14, 2012

(86) PCT No.: PCT/IB2012/053008
§ 371 (c)(1),
(2), (4) Date: Dec. 16, 2013

(87) PCT Pub. No.: WO2012/172505
PCT Pub. Date: Dec. 20, 2012

(65) Prior Publication Data
US 2014/0130794 A1  May 15, 2014

(30) Foreign Application Priority Data
Jun. 15, 2011 (IT) .............................. RM2011A0308

(51) Int. Cl.
C23C 14/06 (2006.01)
C23C 14/00 (2006.01)
(Continued)

(52) U.S. Cl.
CPC ......... C23C 14/0617 (2013.01); C04B 35/581 (2013.01); C04B 35/584 (2013.01);
(Continued)

(58) Field of Classification Search
USPC ........ 359/359, 360; 428/469, 472, 697, 698, 428/699; 501/153, 154
See application file for complete search history.

(56) References Cited

U.S. PATENT DOCUMENTS

2009/0151777 A1* 6/2009 Yin .......................... F24J 2/487
136/252

FOREIGN PATENT DOCUMENTS

| WO | 97/00335 | 1/1997 |
|----|----------|--------|
| WO | 2005/010225 | 3/2005 |
| WO | 2005/121389 | 12/2005 |

OTHER PUBLICATIONS

Du et al "Optimization design of Ti(0.5)Al(0.5)N/Ti(0.25)Al(0.75)N/AlN coating used for solar selective applications" Solar Energy Materials & Solar Cells 95 (2011) p. 1193-1196.*

(Continued)

*Primary Examiner* — Archene Turner
(74) *Attorney, Agent, or Firm* — Nixon & Vanderhye PC

(57) ABSTRACT

A thin-film spectrally selective coating for receiver tube of vacuumed type for use in thermodynamic solar installations and operating both at medium temperature (up to 400° C.) and at high temperature (up to 550° C.), coating where the optically absorbing layer is a multilayer of cermet material of type: $W_yN$—$AlN_x$ or $Mo_yN$—$AlN_x$, material prepared with reactive co-sputtering technique from an Al target and a W or Mo target, process conducted under a transition regimen, under PFM (Plasma Emission Monitoring) or CVM (Cathode Voltage Monitoring) monitoring for the sole Al target, with inletting near the Al target of a $N_2$ amount adequate for obtainment of a high-transparency, high growth rate sub-stoichiometric ceramic AlN and with inletting near the W or Mo target of a $N_2$ amount adequate for obtainment of the sole $W_2N$ or $Mo_2N$ phase, phase very stable at high temperature, such as to make the cermet material as close as possible to the formulation $W_2N$—$AlN_x$ or $Mo_2N$—$AlN_x$ (with x comprised between 0.90 and 1.00, preferably 0.95) and, therefore, cermet material employable at least up to the temperature of 550° C.

42 Claims, 2 Drawing Sheets

(51) Int. Cl.

| | | |
|---|---|---|
| *C23C 14/34* | (2006.01) | |
| *F24J 2/48* | (2006.01) | |
| *C04B 35/581* | (2006.01) | |
| *C04B 35/584* | (2006.01) | |
| *F24J 2/46* | (2006.01) | |
| *C23C 14/14* | (2006.01) | |
| *G02B 1/10* | (2015.01) | |
| *G02B 5/08* | (2006.01) | |

(52) U.S. Cl.
CPC ....... *C23C14/0042* (2013.01); *C23C 14/0641* (2013.01); *C23C 14/0652* (2013.01); *C23C 14/14* (2013.01); *C23C 14/34* (2013.01); *C23C 14/3464* (2013.01); *F24J 2/4652* (2013.01); *F24J 2/485* (2013.01); *G02B 1/10* (2013.01); *G02B 5/085* (2013.01); *C04B 2235/3886* (2013.01); *C04B 2235/75* (2013.01); *C04B 2235/79* (2013.01); *C04B 2235/80* (2013.01); *Y02E 10/40* (2013.01)

(56) References Cited

OTHER PUBLICATIONS

Lei et al "Preparation and thermal stability on non-vacuum high temperature solar selective absorbing coatings" Chinese Sci Bul (2009) p. 1451-1454.*
Int'l Search Report for PCT/IB2012/053008, three pages, mailed Oct. 10, 2012.
Written Opinion for PCT/IB2012/053008, five pages, mailed Oct. 10, 2012.

* cited by examiner

SOLAR SELECTIVE ABSORBER BASED ON DOUBLE NITRIDE COMPOSITE MATERIAL AND PROCESS FOR ITS PREPARATION

This application is the U.S. national phase of International Application No. PCT/IB2012/053008, filed 14 Jun. 2012, which designated the U.S. and claims priority to Italian Application No. RM2011A000308, filed 15 Jun. 2011; the entire contents of each of which are hereby incorporated by reference.

FIELD OF THE INVENTION

The present invention relates to:
an optically selective double-nitride composite material consisting of a ceramic matrix and a component having a metallic behavior nanodispersed therein;
a spectrally selective multilayer coating material for use in solar installations, mainly of thermodynamic type and preferably of the type having linear parabolic mirrors, apt to operate at high temperature;
a process of preparation of the composite material and of the multilayer material; and
a receiver element for thermodynamic solar installations, made with said coating material and a process of coating such receiver element.

BACKGROUND OF THE INVENTION

In the field of thermodynamic solar installations, with reference e.g. to parabolic mirror technology, the receiver element, which in this case is a receiver tube positioned along the focal line of the mirrors, has to act as an absorber. In particular, it should absorb the greatest possible amount of solar radiation concentrated thereon and, at the same time, it should lose to the outside environment the least possible amount of heat stored.

Materials best suited to act as surface coating of the receiver tube are those behaving in an optically selective manner, i.e. those materials whose optical properties of reflectance, absorbance and hemispherical emissivity modify appreciably with the radiation wavelength, passing from the zone of solar spectrum irradiance to the thermal infrared zone.

In particular, it is known that in order to attain an ever greater efficiency of thermodynamic solar installations, the coating material should have a behavior as close as possible to the ideal one, i.e.:
i) null reflectance (unitary absorbance) in the spectral region of solar radiation (0.3-2.0 µm); and
ii) unitary reflectance (null absorbance and emissivity) in the thermal infrared region (2.0-40 µm),
with a step-like passage between the two regions.

To obtain an alike optical behavior, coating materials generally have complex structures providing plural thin layers of suitably selected different materials, each one having different optical properties.

In particular, materials typically used in the field of solar absorbers are complex thin-film or thin-layer structures, fundamentally comprising a so-called cermet-type material.

In general, cermet-type materials are ceramic-metal composite materials made up of a ceramic matrix and a metallic element, or an element having a metallic behavior, dispersed in the ceramic matrix.

In particular, a cermet material for use as solar selective absorber consists of a specific type of composite material where a matrix of highly transparent ceramic material is present, inside which it is dispersed, generally in the form of nanoparticles, a material having metallic features.

In general, in cermets the metallic particles, or the particles having a metallic behavior, are typically of very small sizes, of the order of 10-50 Angstrom (1-5 nm).

Thanks to their peculiar structure, cermets are materials exhibiting a behavior close to said ideal behavior and, thanks to their characteristic optical properties, i.e.:
a) high optical absorption in the solar radiation range (0.3-2.0 µm) and
b) good optical transparency in the infrared radiation range (4-25 µm),
are well suited to be employed in thin-film or thin-layer layering which are referred to as "spectrally selective solar coatings". Moreover, cermet-type materials currently produced for solar coatings exhibit good chemical-structural stability when used under vacuum at average temperatures (lower than 450° C.) and under air at low temperatures (lower than 300° C.).

Due to the reasons disclosed above, cermet materials are the subject of a renewed interest in solar absorbers grade, and in particular as coating materials for heat-collecting receiver elements (receiver tube) in thermodynamic solar installations, in particular of "parabolic trough" type.

As said in the foregoing, a n appropriate structure of a spectrally selective coating material operating as selective optical absorber allows to absorb solar radiation while keeping a low value of thermal emittance at a high temperature. This effect is typically obtained by utilizing a multilayer structure comprising:
i) a metallic layer having high reflectivity in the infrared region, apt to ensure a low emittance value;
ii) a cermet layer having a variable profile, i.e. with a metallic content decreasing with the increase of thickness, to best absorb solar radiation incident on the receiver tube; and
iii) an antireflection layer for minimizing the losses caused by solar radiation reflection.

This typology of coating material proved effective in terms of high performances, i.e. high solar absorbance coupled with low emissivity.

However, cermets currently marketed and utilized as absorbers for receiver elements in solar installations have, as will be better illustrated hereinafter, limitations as regards their chemical-structural stability when subjected to high temperatures (temperatures comprised between 450° C. and 550° C.) and reproducibility of the material, with the consequence of a low reliability in terms of physical and chemical features of the material itself.

Such problems are typical of marketed cermets, and are partly attributable to the materials and processes used for producing them.

SUMMARY OF THE INVENTION

The aim at the basis of the present invention is that of overcoming the drawbacks mentioned above with reference to the known art, drawbacks that, as already said, will be better understood also from the detailed description reported hereinafter.

The solution of the above-mentioned technical problem and further aims are attained by a composite material, a multilayer material, a receiver element and processes of preparation thereof according to the claims hereinafter.

Preferred features of the invention are the subject of the dependent claims.

In particular, the present invention provides an optically selective composite material of double-nitride cermet type, a spectrally selective multilayer coating material for use in solar installations, a receiver element for thermodynamic solar installations made with the coating material of the invention, and the preparing processes thereof.

Object of the invention is a coating material for collecting tubes provided with a good chemical, structural and mechanical stability over the entire operating temperature range, which is well above the temperatures of use of the current coatings; in particular, with reference to thermodynamic solar installations with molten salt-type exchange fluid, the range of interest is between 300 and 550° C.

Another object of the invention is a coating material of the above-mentioned type, apt to provide a high absorbance in the solar radiation region.

A further object of the invention is a coating material of the above-mentioned type, apt to provide a low thermal emissivity even at the maximum operating temperature, preferably equal to 550° C., in a solar installation for power production with linear parabolic mirror technology.

Another object of the invention is a coating material of the above-mentioned type, apt to provide excellent performances in terms of high absorbance and low emissivity over the entire variation range of the operating temperature (300÷550° C.) along a linear collector.

A further and very important object of the invention consists in processes of preparation of the materials of the invention carried out at a high deposition rate, such as are the reactive and non-reactive sputtering processes, in both cases from metallic targets. The high deposition rate markedly influences productivity and, ultimately, abates product cost.

The present invention perfectly answers the need to make an innovative material whose properties, wavelength-selective with respect to solar radiation, allow use thereof as coating of collectors of the linear concentration system of a thermoelectric solar installation operating at medium-high temperature. In fact, the invention provides a layered thin-film material with excellent photo-thermal performances and a high stability under vacuum at high temperature (up to 570° C.). At the same time, the present invention meets the need to propose preparing processes having a high deposition rate and, accordingly, a low product cost.

BRIEF DESCRIPTION OF THE FIGURES

Reference will be made to the figures of the annexed drawings, wherein.

DETAILED DESCRIPTION OF PREFERRED EMBODIMENTS

Figure 1:
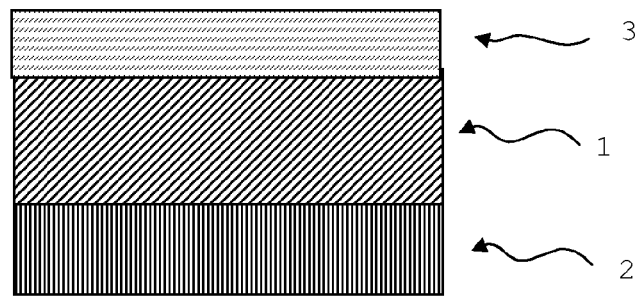
FIG. 1 shows a sectional view of an embodiment of a spectrally selective multilayer coating material having three layers: metallic material layer reflecting in the infrared region of the spectrum; absorber layer of cermet-type material; and layer of antireflection material antireflective to solar radiation.

Hereinafter, some definitions useful to the ends of an understanding of the invention are reported.

Cermet: composite material characterized by a dispersion of metallic nanoparticles, or of nanoparticles having a metallic behavior, in a ceramic matrix.

Graded cermet: cermet material layer characterized by a content of the metallic component, or of the component having a metallic behavior, dispersed in the ceramic matrix, which decreases almost continuously from the innermost layers to the outermost ones of the cermet.

Multilayer cermet: cermet material layer characterized by a content of the metallic component, or of the component having a metallic behavior, dispersed in the ceramic matrix, which decreases step-like from the innermost layers to the outermost layers of the cermet.

Double-nitride cermet: cermet-type material where both the ceramic component and the metallic component, or the component having a metallic behavior, is a nitride.

Metallic behavior: good conductivity and high index of optical absorption.

Compound in a stoichiometric ratio in the present technical field: components in the chemical formula can be represented in terms of ratios between natural numbers.

Sub-stoichiometric compound: one of the chemical elements of the compound is scarce with respect to the stoichiometric value of the compound itself.

Medium temperatures: temperatures lower than 450° C.

High temperatures: temperatures comprised between 450° C. and 570° C.

In the present patent application, when reference is made to a metallic element or component, or to an element or component having a metallic behavior, all metals are meant to be encompassed.

Before turning to the detailed description of some preferred embodiments of the invention, some considerations and experimental tests carried out by the Inventors and at the basis of the attainment of the invention, as well as some elements of the invention itself, will be illustrated hereinafter.

Multilayer Material

As said above, object of the invention is a spectrally selective multilayer coating material for use in solar installations, comprising at least one layer of cermet-type composite material. Such multilayer material also comprises a further layer of metallic material reflecting in the infrared region of the spectrum, underlying said composite material layer and also a antireflection material layer antireflective to solar radiation, lying above the composite material layer.

In some embodiments, there may advantageously be provided an adhesive adaptive layer underlying said metallic material layer.

In some further embodiments there may advantageously be provided a barrier layer, interposed between the metallic material layer and composite material layer, apt to prevent diffusion and/or chemical reaction phenomena between the latter two layers.

Considerations carried out by the Inventors for the selecting and making of each of said layers are illustrated hereinafter.

Composite Material of the Absorber Layer

State of the Art

As indicated in the foregoing, cermets generally used as solar radiation absorber layer are dispersions of nanoparticles of some specific metals in matrices of ceramic materials with suitable features. In particular, metals dispersed in nanometer sizes generally are: Cu, Ni, Co, Pt, Cr, Mo, W, Al, Ag or other. Moreover, definable as materials having a metallic behavior and useful in the preparing of cermet layers are also some transition metal nitrides and carbides, such as: $Ti_xN_y$, $Zr_xN_y$, $Cr_xN_y$, $W_xN_y$, $Mo_xN_y$, $Mo_xC_y$, $W_xC_y$, or other. Materials typically used as ceramic matrices of the cermet layer are generally: SiO, $SiO_2$, $Al_2O_3$, AlN, $Si_xN_y$, MgO, $ZrO_2$ or other.

The technique most used for the making of this typology of cermet layers is the co-sputtering one, i.e. the simultaneous sputtering from two targets of different material, capable one of producing the metallic material (or the material having a metallic behavior) and the other one the ceramic material.

Preliminary Considerations

In order to decide on the usefulness of a given cermet as optically active layer of the multilayer coating material, in particular for solar installations, as well as on the process for producing it, it is advisable to bear the following considerations in mind:
 a) the cermet layer should provide a suitable preparability, meant as the possibility of making a given cermet layer through a depositing technique yielding results repeatable on a broad area with excellent uniformity, high productivity and low cost;
 b) the selected cermet layer should be preparable with a technique allowing accurate control of the metallic content, or of the content having a metallic behavior, and its accurate continuous or step-like variation during the process for obtaining a graded cermet or a multilayer cermet;
 c) the best cermet as a solar selective absorber is that in which dispersion of the metallic component, or of the component having a metallic behavior, in the ceramic matrix is of granular type having a nanometric size, therefore it is important that between the metallic component, or the component having a metallic behavior, and the ceramic component there be scarce wettability, i.e. that the two lattice structures be sufficiently discordant so that the metal immediately tend, during the cermet-preparing process, to spheroidize into the ceramic matrix;
 d) the selected cermet layer should exhibit an absorption coefficient rather high in the solar spectrum range and quickly decreasing towards the near infrared, becoming practically transparent in the medium and far infrared;
 e) the material having a metallic behavior contained in the cermet should have a high melting temperature and a very low diffusion coefficient at high temperatures;
 f) the ceramic material contained in the cermet should exhibit great physical and structural stability at high temperature and, at the same time, a thermal expansion coefficient not excessively low, in order to yield good thermo-mechanical couplings with the various materials underlying and lying above the cermet layer.

Identification of the Problems of the Known Art for Absorber Layer Preparing

As already observed in the foregoing, a cermet material for solar selective absorber use consists of a particular type of composite material where a matrix of highly transparent ceramic material is present, inside which it is dispersed, in the form of nanoparticles, a material having metallic features.

Therefore, in addition to what has been observed hereto, referring to the process of preparation of a cermet as defined above, it is advisable to bear in mind that the ceramic material, when deposited from a ceramic target (RF-type sputtering), would constitute an element retarding the times associated to the preparation of the entire multilayer coating material (also referred to as solar coating), considering the low deposition rate in RF sputtering processes.

In order to overcome the problem set forth above and provide a process of preparation of the ceramic component having a high deposition rate, it is advisable to resort to reactive-type sputtering processes from metallic targets.

To this end, reactive sputtering processes most used today for the making of solar coatings are those making use of oxygen as reactive gas and, accordingly, producing (cermet) ceramic matrices of metal oxide type. In the processing of a metallic target in an oxygen-containing reactive environment, the target encounters the poisoning phenomenon (target surface oxidation) with the entailed presence of the hysteresis phenomenon, yielding instability and scarce process reproducibility. This phenomenon is generally controlled by PEM (Plasma Emission Monitoring)- or CVM (Cathode Voltage Monitoring)-type feedback systems, both capable of accurately managing the amount of reactive gas in the process chamber and preventing poisoning and hysteresis.

For the preparing of a cermet-type composite material obtained by concomitant sputtering of two metallic targets in a reactive (oxidizing) environment, in order to ensure stability and reproducibility of the process and of the material produced, it would be necessary to prevent poisoning and hysteresis on both metallic targets. However, a feedback system is capable of controlling the state of only one of the two targets; therefore, the state of one of the two targets remains out of control, with evident problems on process reproducibility and therefore on the chemical-physical characteristics of the cermet produced.

To better understand the above-mentioned problems related to cermets currently in use, hereinafter it is reported an example related to Mo—$Al_2O_3$ cermet, widely employed in solar coating operating at high temperature.

In case of the Mo—$Al_2O_3$ composite material (obtained by co-sputtering process from two metallic targets—Al and Mo—using an Ar+$O_2$ mixture as sputtering gas) both metallic targets tend to become "poisoned" and give rise to hysteresis and process instability. In this case, the Al target can be put under control with a feedback system, seeking to limit as much as possible a high oxygen concentration near the Mo target, by exploiting also the lesser reactivity of this metal in an oxidizing environment.

However, no matter how many precautions may be adopted at the technological level on the sputtering plant and on the reactive co-sputtering process, unavoidably in the preparing of Mo—$Al_2O_3$-type cermet also a certain amount of molybdenum oxide $MoO_3$, both α-phase and β-phase, is formed. Therefore, the cermet actually obtained in this type of process is more likely a composite of Mo—$MoO_3$—$Al_2O_3$ type, not having the same chemical stability of a "pure" Mo—$Al_2O_3$ cermet under-high temperature.

Overcoming the Problems of the Known Art

In the light of such problems reported above with reference to the technical specifications of the material (preparability, high productivity, low cost, obtainment of cermet in a graded or multilayer form, appropriate pattern of optical absorption spectrum, high thermal stability, CTE not too low), and having illustrated the reasons due to which it is convenient to operate under reactive sputtering regimen, as well as the presence of a series of limitations in operating with oxygen, the Inventors have devised and tested new cermet-type materials.

In particular, double-nitride cermets of $M_yN_z$—AlN type have been devised and made, where $M_yN_z$ is the metallic component/component having a metallic behavior and AlN is the ceramic matrix of the composite material. By "M", transition metals are denoted, in particular transition metals whose nitrides have a mainly metallic behavior. Preferred metals are in particular W and Mo and, subordinately, Ti and Zr.

As will be better illustrated hereinafter, according to an embodiment of the invention the preparing of the optically absorbing composite material (cermet) of $M_yN_z$—AlN type is conducted with a reactive co-sputtering process from two metallic targets (M and Al) and by using a sputtering gas comprising nitrogen ($N_2$), and preferably a gas comprising an Ar+$N_2$ mixture.

In the preparing of $M_yN_z$—AlN cermet (e.g. of graded type), the AlN material (cermet matrix) is produced at a constant cathode power and under nitrogen flow conditions causing the maximum depositing rate compatible with a highly transparent sub-stoichiometric AlN. This nitrogen flow is not a preset parameter of the process, but rather its value is determined and managed with a feedback system, which may be, e.g., of PEM (Plasma Emission Monitoring) type or of CVM (Cathode Voltage Monitoring) type, capable of accurately managing the amount of reactive gas in the process chamber.

Through these technologies it is possible to keep continuously scarce the nitrogen supply to the aluminum target, thereby preventing any poisoning or hysteresis phenomenon on the metallic target.

At the same time, the $M_yN_z$ material dispersed in the cermet is produced by varying the cathode power (with a power value decreasing in a gradual or step-like manner) in order to obtain a graded- or multilayer-type cermet material with a high metallic content at the start, and a low metallic content at the end of the process.

In doing this, if no specific contrivances related to the cermet-forming process are adopted, a deposited $M_yN_z$ metallic component of the cermet could be had, component which at the start of the process will be scarcely nitrided with respect to that deposited at the end of the process.

Problem of Instability of the Absorber Layer Associated to the Forming Process

A relevant condition of the graded- or multilayer-type cermet forming process is that $N_2$ flow may not be varied in order not to affect AlN grade. This entails the drawback that, as cermet layer deposition is carried on, by lowering the cathode power of the material M and its sputtering rate, in the AlN matrix of the cermet metal nitride particles will be inserted, in which metal will gradually grow scarce with respect to nitrogen (increasingly nitrided metal).

Such a phenomenon is particularly relevant, since the nitriding level of the metallic material markedly determines the properties of chemical and structural stability of the cermet component having a metallic behavior.

In fact, $M_yN_z$ materials unstable at high temperatures cause forming of $M_yN_z$—AlN cermets, them also thermally unstable. Therefore, solar coatings comprising $M_yN_z$—AlN cermets will be them also unstable at high temperatures.

Actually, $M_yN_z$ materials sufficiently nitrided, e.g. with a $M_2N$-type structure, are very stable even at high temperature, whereas scarcely nitrided $M_yN_z$ materials, following annealing above 500° C., give rise by dismutation to a mixed material of nitride+metal ($M_2N$+M) type. At the same time, excessively nitrided $M_yN_z$ materials, following annealing above 500° C., give rise to crystalline structure readjustments with nitrogen release.

Ultimately, only for rather but not excessively heavy nitriding values, the $M_yN_z$ material obtained by reactive sputtering may be considered sufficiently reliable from the standpoint of thermal stability and, accordingly, introduced in the AlN matrix it can give rise to cermet materials stable at high temperatures.

Solution of the Absorber Layer Instability Problem

In the light of such instability problem, the invention provides a localized $N_2$ inletting, besides near the Al target, also near the target of the material M. Such localized $N_2$ inletting near the M target should be properly calculated so as to obtain not overly heavy nitridings of the $M_yN_z$ material, i.e. nitridings as near as possible to the stoichiometric value, for all powers necessary to the preparing of a graded or multilayer cermet and such as to include (in the cermet produced) nanoparticles of stoichiometric and stable $M_2N$.

As further illustrated hereinafter, such inletting of $N_2$ localized near the target of the material M does not alter the course of the sputtering process of the AlN material conducted under a "transition regimen" and managed with a feedback system.

Metallic IR Reflector Layer

Identification of Features Necessary for Metal Usability as IR Reflector Layer of a Multilayer Material in Solar Installations Metals generally used as infrared reflectors are: Mo, W, Ag, Cu, Au, or other.

For each of the metals listed above, in order to decide on the usability thereof as metallic material layer reflecting in the infrared region of the spectrum of a multilayer coating material for use in solar installations, it is advisable to accurately analyze some features such as:

a. spectral reflectance in the 1-25 μm range;
b. structural stability under vacuum at the operating temperature of a receiver element, such as, e.g., a receiver tube;
c. physical-chemical stability, at the operating temperature of the receiver tube, in an environment containing an oxidizing gas and checking of volatile oxide formation at high temperatures;
d. adhesion properties, primarily on steel or, alternatively, on other type of material making up the receiver element on which the coating material is to be applied;
e. elemental diffusion coefficient at high temperature of the metallic material reflecting inside said ceramic materials, typical of cermets matrix;
f. ability to behave as barrier layer for diffusion phenomena of elements migrating from steel or from other type of material making up the receiver element on which the coating material is to be applied.

Analysis Carried Out on Mo, W, Ag, Cu and Au

Concerning in particular Mo, W, Ag, Cu and Au, it was found that:

a. Infrared reflectance: Au, Ag and the same Cu are the metals offering best spectral performances, as they have very high reflectance values even in the near infrared (1-4 μm range); this allows an optical cutoff with a very steep rise in the transit from the solar absorbance zone to the thermal emittance zone; said behavior influences the spectrally selective multilayer coating material, by keeping low the emissivity values even in the presence of high temperatures;

b. structural stability under vacuum at high temperature: all metals listed exhibit good reliability, with a preference for W and Mo;

c. physico-chemical stability under oxidizing environment: Au are Ag are the stabler ones, whereas Mo forms volatile oxides at T>350° C. and W forms volatile oxides at T>470° C.

d. steel adhesion properties: Mo has very good adhesion properties and W rather good ones, whereas Au, Ag and Cu have very poor adhesion properties (adhesion that can be improved by interposing between steel and metal a suitable layer having strong adhesive features);

e. high temperature diffusion properties: Ag, Cu and Au exhibit high diffusion coefficients, whereas Mo, and above all W, have very low diffusion coefficients, giving, at the operating temperature and for long times, stability to the above-lying cermet-type composite layer;

f. barrier effect on steel: Mo, and above all W, are materials extremely effective and adapted to behave as barrier layer for diffusion phenomena of elements migrating from steel.

Metallic Material Selection

From the analysis carried out hereto, it is evident that in the selection of the metallic material reflecting in the infrared region of the spectrum (hereinafter also referred to as metallic IR reflector) it is advisable to find a compromise among all properties and therefore among the different behaviors listed above. In particular, the selection of the material to be used as reflector will be determined, among other things, by the temperature to which the spectrally selective multilayer coating material is subjected during its use.

For use in solar installations operating at high temperature (i.e., up to 550° C.), W, and subordinately Mo, proves to be the most reliable material. In this case, according to an embodiment of the invention, the reflecting metallic material layer is made with a crystalline structure (of W and of Mo) having the best infrared reflectance, i.e. with an α-phase crystalline structure. Such structure, as will be better illustrated hereinafter, is fostered by a process of preparation which preferably provides: i) very heavy (<5*10$^{-7}$ mbar) basic vacuum in the sputtering chamber, with a very low residue of $CO_2$ and $H_2O$; ii) highly clean substrate (e.g., steel tube), preheated prior to the sputtering process; iii) preliminary deposition on the substrate (e.g. of steel) of a ceramic or cermet-type composite layer (in alternative embodiments this step is not present); iv) sputtering process having a high energetic impact (high cathode power, sufficiently low pressure in the chamber, BIAS applied on the substrate) for the depositing of the metallic IR reflector material.

For use in solar installations operating at medium-low temperatures (<450° C.) and in the hypothesis of pursuing higher performances (very low emissivity at high temperature), use of Ag, and also of Cu, is worth considering. Both of these metals can be used, preferably improving their adhesion on steel (or other material constituting the substrate) with interposition of an adhesive adaptive layer having a barrier effect, which is it also the subject of a preferred embodiment of the spectrally selective multilayer coating material according to the invention.

Adhesive Adaptive Layer

Such layer can be of the type selected from a group comprising: W, Mo, Ti, Zr, AlN, W+AlN, Mo+AlN, Ti+AlN, Zr+AlN, $W_xN$—AlN cermet, $Mo_xN$—AlN cermet, $TiN_x$, $ZrN_x$, $Al_2O_3$, $W+Al_2O_3$ and $Mo+Al_2O_3$.

In case of use of Ag or Cu as metallic IR reflector, the adhesive layer is preferentially of W type or of Mo type, with preferential growth along axis c such as to foster growth of Ag or Cu thereon with a preferential orientation (111). In particular, in order to obtain the best lattice coupling and to maximize the adhesion properties of the Ag or Cu metallic reflector, it is advisable to deposit a first layer of a crystalline form W (or Mo) and a second layer of β crystalline form W (or Mo).

In short, referring to the IR reflector and according to a preferred embodiment of the invention, the material best suited for use in a multilayer solar coating material operating at high temperature (up to 550° C.) is W, and, subordinately, Mo, with the possibility, as will be better illustrated hereinafter, of suitably treating the substrate of the receiver element (heating, plasma etching, "preliminary" ceramic or cermet-type composite layer) and operating for the making of the IR reflector with a sputtering process having a high energetic impact.

Vice versa, referring to the IR reflector and according to a preferred embodiment of the invention, the material most suitable for use in a multilayer solar coating material operating at a medium-low temperature (<450° C., preferably 400° C.) is Ag, and, subordinately, Cu, upon depositing an adequate adhesive adaptive layer underlying, and, as will be better illustrated hereinafter, lying above the IR reflector layer.

W(Mo)/CERMET Interface

Experimental Tests and Criticality Detection

Experimental checking performed during the carrying out of the invention show presence of chemical reactivity at high temperature between the reflecting metallic layer, made e.g. with W or Mo, and the AlN ceramic matrix of the cermet-type composite material.

In particular, materials such as W and Mo, having rather open, fourfold-symmetry structures, can give rise to high reactivity towards nitrogen (present in the ceramic matrix comprised of aluminum nitride AlN and made according to the invention with a reactive co-sputtering process under a nitrogen-containing atmosphere) whereas rather packed threefold-symmetry structures give rise to low reactivity.

A further relevant factor affecting the reactivity level between W or Mo and AlN is represented by the type of process by which the AlN ceramic matrix is produced. In general, AlN reactivity is particularly high when it is produced by reactive sputtering under a gas particularly rich in nitrogen (under condition of Al target poisoning, with formation of super-stoichiometric-type AlN). Therefore, in case of an embodiment of the multilayer coating material of the present invention in which the cermet layer ($M_yN_z$—AlN, where M is, e.g., W or Mo) is directly deposited on the metallic IR reflector (of W or Mo), in the presence of high temperatures chemical reactions can occur which cause a degradation of the AlN—W (or Mo) interface. In other words, the depositing of a cermet layer according to the invention ($W_yN$—AlN or $Mo_yN$—AlN) directly on the metallic IR reflector (of W or Mo) can entail an interface where AlN and W (Mo) would be in intimate contact, with a possible high-temperature chemical reaction (interface degradation).

From the testing, it appeared that for temperatures lower than 450° C. the reaction, at the interface, is so slow as to be difficult to observe, which is why a use of a cermet layer—metallic IR reflector structure (cermet/M where M is metal) as described above, at temperatures not overly high, does not entail instability problems. This is the case of spectrally selective multilayer coating materials for use on receiver tubes operating with exchange fluids (diathermic oil) at medium-low temperature (400° C.).

Otherwise, it was verified that at medium-high temperatures (>450° C.) the reaction between AlN and W or Mo at the cermet/M interface, where the metal has a rather open structure and AlN has been produced under a gas particularly rich in nitrogen, may be appreciable and is of type:

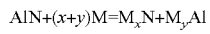

At the same time, it was verified that, by keeping the multilayer coating material at a high temperature (570° C.), the above-described reaction does not saturate, but can produce a gradual degradation of the cermet/M interface, degradation manifesting itself in a gradual worsening of the reflectivity of the metallic IR reflector and, accordingly, of the emissivity of the multilayer coating material. This means that, for a use on receiver tubes operating with exchange fluids (molten salts) at a high temperature (550° C.), it can be advisable to exclude an interface between a cermet ($W_yN$—AlN or $Mo_yN$—AlN) layer produced by $N_2$ saturation on the Al target and the metallic IR reflector of W or Mo (with a fourfold symmetry structure) in order to avoid risks of instability and degradation of performances of the multilayer coating material.

Solution to the Problems Highlighted by the Experimental Tests

Due to the reasons set forth above, for the making of the spectrally selective multilayer coating material capable of operating at high temperature (550° C.) according to an embodiment of the invention it is envisaged to deposit and use reflecting metallic layers, e.g. of W or Mo having a rather packed (threefold symmetry) structure, by highly energetic sputtering processes (high cathode power, low pressure, BIAS) compatibly with the thermo-mechanical stability of said layer with the substrate of steel (or of other materials). In fact, layers of reflecting metallic materials (W or Mo) having an excessively packed structure exhibit a high compressive-type inherent stress, with serious problems of adhesion and thermo-mechanical stability under temperature cycling. What said hereto entails the search for a compromise between the need to obtain structures having a high packing factor (metal reactivity decrease) and the need not to reach excessive packing values, with the entailed creation of compressive stress compromising adhesion on the substrate.

Always for the reasons set forth above, for the making of the spectrally selective multilayer coating material capable of operating at high temperature (550° C.) according to an embodiment of the invention, it is envisaged the depositing directly on the metal (W or Mo) the graded cermet ($W_yN$—AlN or $Mo_yN$—AlN) layer under a process gas environment such that the Al target be working under a transition regimen (PEM or CVM monitoring) in order to produce a cermet with the sub-stoichiometric AlN matrix, since it has been verified that the sub-stoichiometric AlN matrix has a low reactivity towards the metallic (W or Mo) layer.

Barrier Layer

According to a variant of the invention, the spectrally selective multilayer coating material envisages a barrier layer interposed between the layer of reflecting metallic material and the layer of optically absorbing composite material of cermet type.

This barrier layer has been the subject of testing by the Inventors. Desired properties for such layers are that it be:
stable and chemically inert towards W (or Mo) even at very high temperatures (up to 600° C.);
transparent in the IR spectral region and sufficiently thin (5-50 nm), in order not to compromise overall optical behavior of the entire multilayer coating material;
sufficiently compact, having a cover conformal to the surface of the reflecting metallic material (e.g. of W or Mo), in order to completely eliminate intimate contact between the reflecting metallic material and the cermet layer (which is deposited after the barrier layer during the process of preparation of the multilayer material);
having good diffusion process blocking properties;
thermo-mechanically adaptable to the bottom layer (metallic, preferably of W or Mo) and top layer (cermet).

On the basis of the above-disclosed specifications, according to an embodiment of the present invention also the barrier layer is made with a cermet-type material of $W_xN$—$AlN_yO_z$ type or of $Mo_xN$—$AlN_yO_z$ type, having a high metallic content. As it will be apparent hereinafter, the barrier layer is produced with a co-sputtering technique, using a metallic target, preferably of W (or Mo), and an Al target, with nitrogen inletting near both targets and oxygen inletting near the sole Al target. Said layer should be characterized by a ceramic matrix ($AlN_yO_z$), on average with a low z/y ratio, ranging between 0.1 and 0.4, such as to ensure a low reactivity to the $W_xN$—$AlN_yO_z$ (or $Mo_xN$—$AlN_yO_z$) layer towards the underlying metal (W or Mo).

To sum up, according to an embodiment of the invention, in order to produce spectrally selective multilayer coating materials based on graded cermet of $M_yN_z$—AlN type (preferably $W_yN_z$—AlN or $Mo_yN_z$—AlN) chemically stable over time at a high temperature, it is possible to interpose between this cermet layer and the reflecting metallic material (preferably of W or Mo) a thin layer having a barrier effect, of $W_xN$—$AlN_yO_z$ or $Mo_xN$—$AlN_yO_z$ cermet type.

The preferred embodiments of the invention will presently be described with reference to the figures introduced above.

Referring initially to FIG. 1, an optically selective composite material 1 of double-nitride cermet type is depicted by way of example as inserted in a spectrally selective multilayer coating material.

As already described in the foregoing, the optically absorbing composite material of double-nitride cermet type consists essentially of a ceramic matrix and a component having a metallic behavior nanodispersed therein. According to the invention, the ceramic matrix is an aluminum or silicon nitride (preferably $AlN_x$) wherein the ratio between aluminum (Al) or silicon (Si) and nitrogen (N) is sub-stoichiometric and the component having a metallic behavior is a nitride of MyNz type wherein M is a transition metal and the ratio between M and N is stoichiometric. In particular, said ratio between M and N is such that essentially the $M_2N$ phase be present.

According to an embodiment, the ceramic matrix is comprised of:
an aluminum nitride $AlN_x$ with x comprised in a range 0.90≤x<1.00 and in particular being equal to 0.95; or
a silicon nitride $Si_3N_{4-k}$ wherein k>0.

For what said in the foregoing with reference to the original considerations and tests by the Inventors in connection with the absorbing layer, the transition metal M forming the component having a metallic behavior of the cermet-type material is selected from a group comprising: W, Mo, Ti, Zr, and in particular it is preferably W or Mo.

In particular, preferably in the optically absorbing graded or multilayer cermet-type composite material the component having a metallic behavior is distributed in the ceramic matrix respectively according to a gradient or according to a step-like pattern.

Referring to FIG. 1, the invention further refers to a spectrally selective multilayer coating material for use in solar installations, in particular thermodynamic solar installations operating preferably at medium-high temperatures (up to 550° C.).

The spectrally selective multilayer coating material comprises at least one layer 1 of the above-described optically absorbing composite material of cermet type.

In particular, according to the embodiment depicted in FIG. 1 the multilayer coating material comprises a further layer of metallic material 2 reflecting in the infrared region of the spectrum, underlying said cermet material layer 1, and a further layer of antireflection material 3 antireflective to solar radiation, lying above said cermet-type composite material layer 1.

In particular, the cermet-type composite material layer has a thickness comprised in the range of about 0.05-0.15 μm.

For what was illustrated above with reference to the metallic IR reflector, the metallic material layer 2 is selected from a group comprising W, Mo, Ag, Cu, Au; in particular, for their features W or Mo are preferred when in α-phase.

The metallic material 2, in particular when comprising W or Mo, has a threefold-type high-compactness α-phase crystalline structure (high reflectivity).

The metallic material layer 2 preferably has a thickness comprised in the range of about 0.06-0.60 μm.

Always referring to FIG. 1, the antireflection material 3 is aluminum nitride (AlN) or $Al_2O_3$, or $SiO_2$ and/or preferably has a thickness comprised in the range of 0.02-0.15 μm.

Figure 3:
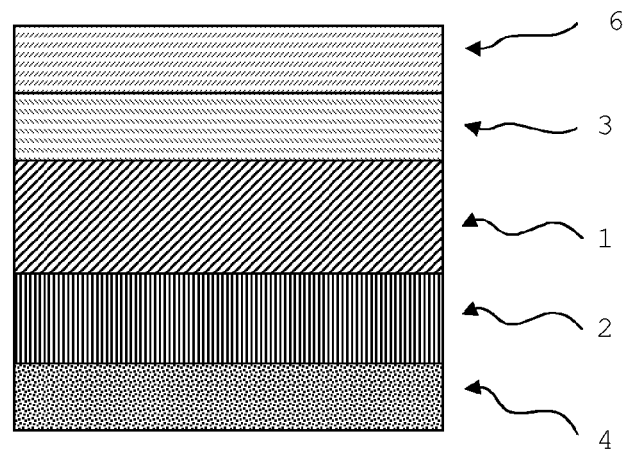
FIG. 3 shows a sectional view of a third embodiment of a five-layer spectrally selective multilayer coating material, in which a further adhesive adaptive layer underlying the metallic material layer is added to the four layers of the embodiment of FIG. 2.

Referring to FIG. 3, according to an alternative embodiment, the multilayer coating material comprises a further adhesive adaptive layer 4 underlying said metallic material layer 2, which has the purpose of increasing the adherence of the metallic layer 2 on a substrate to which the coating material is applied, and has the further purpose of fostering growth of a threefold-type, high-compactness reflecting metallic layer of α-phase W or Mo having a high IR reflectivity.

The adhesive adaptive layer 4 has a thickness preferably comprised in the range of about 0.02-0.12 μm and/or comprises one or more elements of the group comprised of: W, Mo, Ti, Zr, W+AlN, Mo+AlN, Ti+AlN, Zr+AlN, $TiN_x$, $ZrN_x$ AlN, $Al_2O_3$, $W+Al_2O_3$, $Mo+Al_2O_3$, $W_xN$—AlN, $Mo_xN$—AlN. Preferably, it is of Mo, W, Ti, $Al_2O_3$ or $Mo+Al_2O_3$ type when it serves as adhesive layer for the metallic IR reflector of Ag or Cu type; preferably of W or Mo type with a first layer of α crystalline form W (or Mo) and a second layer of β crystalline form W (or Mo); whereas it is preferably of $WN_x$—AlN, $MoN_x$—AlN, $Al_2O_3$, $W+Al_2O_3$ or $Mo+Al_2O_3$ type when it serves as adaptive layer fostering α-phase growth for metallic IR reflector of W or Mo type.

Figure 4:
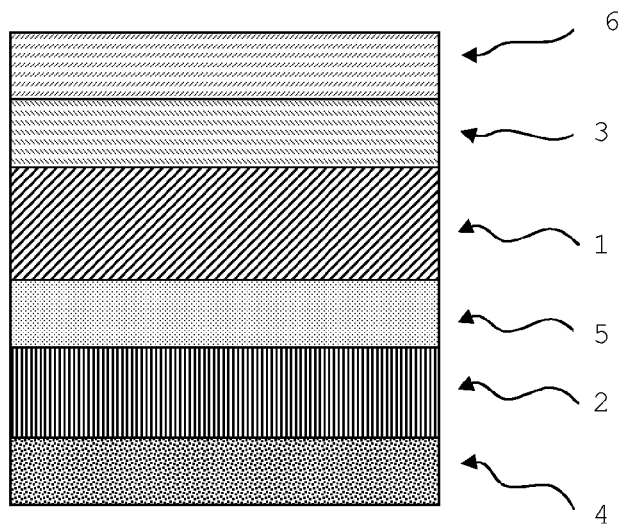
FIG. 4 shows a sectional view of a fourth embodiment of a six-layer spectrally selective multilayer coating material, in which a further barrier layer of interposition between the metallic material layer and the absorber layer of cermet-type material is added to the five layers of the embodiment of FIG. 3.

Referring to FIG. 4, according to a further alternative embodiment, the multilayer coating material comprises a further barrier layer 5 of interposition between the layer 2 of reflecting metallic material and the layer 1 of cermet material, apt to prevent diffusion and/or chemical reaction phenomena between the latter two layers.

The barrier layer 5 has a thickness preferably comprised in the range of about 0.005-0.05 μm, and it is a cermet material of type: $W_xN$—$AlN_yO_z$ or $Mo_xN$—$Al_yNO_z$. As said in the foregoing when discussing the barrier layer, the latter is a cermet-type material having a high metallic content, with a 30%-50% percent of the component having a metallic behavior (WxN or MoxN) with respect to the ceramic component $AlN_yO_z$. Moreover, it has a z/y ratio between $W_xN$—$AlN_yO_z$ or $Mo_xN$—$Al_yNO_z$ preferably comprised in the range of about 0.1-0.4.

Always according to an embodiment of the invention, the cermet-type material layer 1 is graded or multilayer and the metallic component of the cermet material layer 1 decreases from the innermost interface, between cermet layer and metallic layer or between cermet layer and barrier layer, to the outermost one between cermet layer and antireflection material layer, according to respectively a gradient or step-like pattern.

Figure 2:
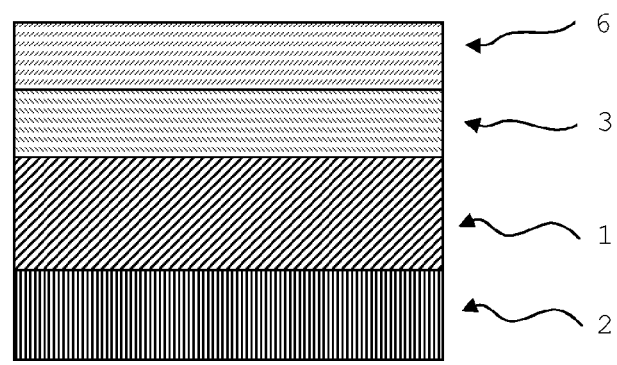
FIG. 2 shows a sectional view of a second embodiment of a four-layer spectrally selective multilayer coating material, in which a second antireflection material layer antireflective to solar radiation is added to the three layers of the embodiment of FIG. 1.

Referring to FIGS. 2, 3 and 4, the multilayer coating material comprises a further second antireflection material layer 6 lying above the first antireflection material layer 3.

The second antireflection material layer 6 preferably has a thickness comprised in the range of about 0.02-0.15 μm (like the underlying layer) and is, always preferably, $SiO_2$ or $Al_2O_3$.

From the present detailed description of some exemplary embodiments of the materials object of the present invention, it is evident that the additional layers listed above, adhesive adaptive layer 4, barrier layer 5 and second antireflection material layer 6, which constitute the spectrally selective multilayer coating material, may all three be present to form a six-layer multilayer material; or only two of them may be present, according to any one combination (adhesive adaptive layer 4 and barrier layer 5; barrier layer 5 and second antireflection material layer 6; adhesive adaptive layer 4 and second antireflection material layer 6) to form a 5-layer multilayer material; or they may each be individually present to form a four-layer multilayer material.

In the configuration envisaging a single antireflection layer, the AlN layer may also be, as said, alternatively $SiO_2$ or $Al_2O_3$. Vice versa, in the configuration with two antireflection layers, the sequence should be AlN (first layer)+ $SiO_2$ or $Al_2O_3$ (second layer).

Figure 5:
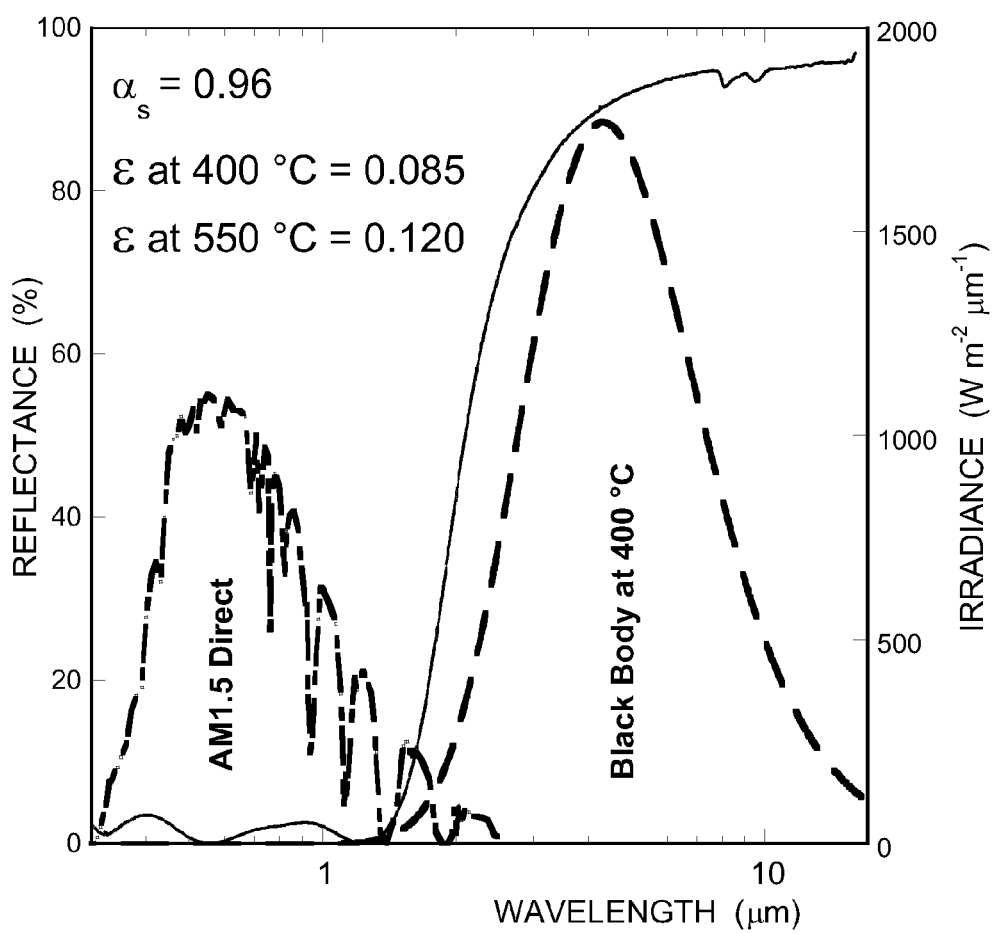
FIG. 5 is a diagram showing the experimental spectral reflectance of a multilayer coating material made in a laboratory according to the embodiment of FIG. 2; in the same figure the experimental data related to the photo-thermal parameters of interest are reported, in particular solar absorbance $\alpha$ and hemispherical emissivity $\epsilon$ assessed at two different operating temperatures (400 and 550° C.).

Referring to FIG. 5, the multilayer coating material according to the four-layer embodiment comprises a layer of W as metallic IR reflector, a layer of graded-type cermet material $W_2N$—$AlN_x$, a layer of AlN as first antireflection layer and a layer of $SiO_2$ as second antireflection layer, and has, at operating temperatures of about 550° C., absorbance α higher than 0.95 and emissivity $\epsilon_h$ lower than 0.14.

Hereinafter, there will be illustrated first the process of preparation of the optically absorbing cermet-type composite material, and then the process of preparation of the spectrally selective multilayer coating material for use in solar installations, in particular thermodynamic ones.

The process of preparation of the optically selective double-nitride cermet-type composite material is based, as illustrated in the foregoing (in connection to the cermet absorber layer), on reactive co-sputtering technology under nitrogen-containing atmosphere with a dual metallic target, (i) M and (ii) Al or Si. According to the invention, independent nitrogen flow is provided for each metallic target (i) and (ii) (M, Al or Si) and the process comprises the substantially concomitant steps of:

depositing aluminium or silicon nitride $AlN_x$ or $Si_3N_{4-k}$ in a sub-stoichiometric ratio;

depositing MyNz produced by the M target in a stoichiometric ratio and, specifically, such that essentially the $M_2N$ phase be present.

In particular, according to a process of the invention said substantially concomitant steps envisage:

depositing aluminium or silicon nitride produced by the Al or Si target, operating under constant cathode voltage and nitrogen flow kept scarce, such as to obtain $AlN_x$ or $Si_3N_{4-k}$ in a sub-stoichiometric ratio;

depositing MyNz produced by the M target operating at decreasing cathode power and nitrogen flow and in a ratio such as to obtain $M_yN_z$ in a stoichiometric ratio, i.e. such as to obtain preferentially the $M_2N$ phase.

According to the invention, said nitrogen flow at the Al target is monitored and varied through a feedback system so as to keep the Al/N ratio sub-stoichiometric during the entire process.

In particular, the feedback system is preferably of PEM (Plasma Emission Monitoring) or CVM ("Cathode Voltage Monitoring") type.

The nitrogen-containing atmosphere in which the sputtering process occurs preferably comprises an $Ar+N_2$ mixture.

The process provides the making of a cermet-type composite material as previously defined; therefore, the metallic target M is a transition metal M preferably selected from a group comprising W, Mo, Ti and Zr, and even more preferably it is W or Mo.

According to embodiments of the process of the invention, the step of depositing aluminum or silicon nitride produced by the Al or Si target, carried out by operating under constant cathode voltage and nitrogen flow kept scarce, is such as to obtain $AlN_x$ or $Si_3N_{4-k}$ in a sub-stoichiometric ratio, with x of $AlN_x$ comprised in a range $0.90 \leq x < 1.00$ and k of $Si_3N_{4-k}$ greater than zero (K>0). In particular, x of $AlN_x$ is preferably equal to 0.95.

Hereinafter, it is described the process of preparation of the spectrally selective multilayer coating material for use in solar installations, in particular thermodynamic ones.

In particular, it envisages all the steps listed hereto with reference to the making of the optically absorbing cermet-type composite material.

Referring to the embodiment of FIG. 1, the process further comprises in a time sequence:

a first step of depositing a metallic material layer 2 reflecting in the infrared region of the spectrum;

a second step of depositing a double-nitride cermet 1 through said process of preparation of the above-described optically absorbing composite material of double-nitride cermet type; and a third step of depositing a first antireflection material 3 antireflective to solar radiation.

According to an embodiment of the invention, the step of depositing a metallic material layer 2 is carried out so as to obtain a crystalline α phase of the metallic material that, as described in the foregoing, allows obtaining higher reflectivity of the layer.

In particular, the process is conducted so as to preferably obtain a cermet material layer 1 with a thickness comprised in the range of about 0.05-0.15 μm; and/or a metallic material layer 2 selected from a group comprising W, Mo, Ag, Cu, Au and/or a metallic material 2 having an α-phase crystalline structure; and/or a metallic material layer 2 with a thickness comprised in the range of about 0.06-0.60 μm; and/or an antireflection material layer 3 comprising AlN; and/or an antireflection material layer 3 having a thickness comprised in the range of about 0.02-0.15 μm.

Referring to a further embodiment, the process comprises a preliminary step, preceding the first step of depositing a metallic material layer 2, of depositing, carried out through sputtering technique, of a further adhesive adaptive layer 4.

As said in the foregoing, the adhesive adaptive layer 4 is preferably made with a thickness comprised in the range of about 0.02-0.12 μm; and/or comprises one or more elements of the group comprised of: W, Mo, Ti, Zr, W+AlN, Mo+AlN, Ti+AlN, Zr+AlN, $TiN_x$, $ZrN_x$, AlN, $Al_2O_3$, $W+Al_2O_3$, $Mo+Al_2O_3$, $W_xN$—AlN, $Mo_xN$—AlN.

Referring to a further embodiment, the process comprises a further step of depositing, carried out through reactive co-sputtering technique, a barrier layer 5 interposed between the metallic material layer 2 and cermet material layer 1, apt to prevent diffusion and/or chemical reaction phenomena between the latter two layers.

Always as said in the foregoing, the barrier layer 5 is preferably made with a thickness comprised in the range of about 0.005-0.05 μm; and/or is selected from a group comprising cermet: $W_xN$—$AlN_yO_z$ and $Mo_xN$—$Al_yNO_z$; and/or the z/y ratio is comprised in the range 0.1-0.4; and/or the cermet is of high metallic content of WxN or MoxN, and comprised in a percent range of 30%-50% with respect to the ceramic component $AlN_yO_z$.

With reference to a further embodiment, the process comprises a step of depositing, carried out through reactive sputtering technique, a further second layer of antireflection material 6 lying above the first antireflection material 3.

Again, as said in the foregoing, the second antireflection material layer 6 is $SiO_2$ or $Al_2O_3$; and/or is preferably made with a thickness comprised in the range of about 0.02-0.15 μm.

Referring to the first step of depositing the metallic material layer 2, it is carried out through sputtering technology, operating at high cathode power density and low pressure, whereas the third step of depositing of the first antireflection material 3 is carried out through reactive sputtering technology.

In particular, referring to the step of depositing the metallic material layer 2, the cathode power density is comprised between about 8 and 18 $W/cm^2$ and/or said low pressure is comprised between about 0.6 and 6.0 μBar.

Always referring to the step of depositing the layer of metallic material 2 or the further adhesive adaptive layer 4, the process comprises the further preliminary steps of:

making a heavy vacuum condition (about $<5*10^{-7}$ mbar) in a sputtering operating chamber;

minimizing $CO_2$ and/or $H_2O$ residues on the surface of a substrate to be coated;

cleaning and preheating a deposition substrate.

In particular, the above-listed preliminary steps envisage:

an argon plasma treatment of the surface of the substrate by means of ion beam technique at a cathode voltage comprised in the range of about 2-5 kV and at a pressure comprised in the range of about 5-30 μbar; and/or a heating of the substrate at a temperature comprised between about 100 and 300° C. under vacuum with a pressure value comprised in the range of about $5*10^{-7}$-$1*10^{-5}$ mbar.

The invention further relates to receiver elements of solar installations, comprising a spectrally selective multilayer coating material according to the invention. In particular, the receiver element is preferably a receiver tube apt to contain a heat-carrying fluid, made of steel or other material suitable for the purpose. Of course, the above-described processes are used for applying the spectrally selective multilayer coating material to the receiver element.

Therefore, the invention further relates to a process of coating for said receiver element which comprises one or more steps of the above-described process of preparation of the spectrally selective multilayer coating material for use in solar installations.

Lastly, it will be appreciated the fact that the coating material according to the invention is apt to operate both under vacuum (up to the temperature of 570° C.) and under air (up to the temperature of 450° C.). Such high limits of maximum operating temperature are an exclusive peculiarity of the coating according to the invention, well above those related to marketed solar coatings, and are attributable to the high chemical-structural stability of the materials used, to their sequence in the layering constituting the coating and to the processes used for preparing them.

EXAMPLES

Examples of embodiments of the multilayer material of the invention, given by way of a non-limiting example.

Example 1 the material illustrated in FIG. 1 was made.

| Layer | Material | Thickness |
| --- | --- | --- |
| 1—cermet | tungsten nitride-aluminum nitride | about 0.10 μm |
| 2—reflecting metallic | (α-phase) tungsten | about 0.13 μm |
| 3—antireflection | aluminum nitride | about 0.08 μm |

Example 2 the material illustrated in FIG. 2 was made.

| Layer | Material | Thickness |
| --- | --- | --- |
| 1—cermet | tungsten nitride-aluminum nitride | about 0.10 μm |
| 2—reflecting metallic | (α-phase) tungsten | about 0.13 μm |
| 3—antireflection | aluminum nitride | about 0.08 μm |
| 6—$2^{nd}$ antireflection layer | $SiO_2$ | about 0.08 μm |

Example 3 the material illustrated in FIG. 3 was made.

| Layer | Material | Thickness |
| --- | --- | --- |
| 1—cermet | tungsten nitride-aluminum nitride | about 0.10 μm |
| 2—reflecting metallic | (α-phase) tungsten | about 0.13 μm |
| 3—antireflection | aluminum nitride | about 0.08 μm |
| 6—$2^{nd}$ antireflection layer | $SiO_2$ | about 0.08 μm |
| 4—adhesive adaptive | $Al_2O_3$ | about 0.06 μm |

Example 4 the material illustrated in FIG. 3 was made.

| Layer | Material | Thickness |
| --- | --- | --- |
| 1—cermet | tungsten nitride-aluminum nitride | about 0.10 μm |
| 2—reflecting metallic | (α-phase) tungsten | about 0.13 μm |
| 3—antireflection | aluminum nitride | about 0.08 μm |
| 6—$2^{nd}$ antireflection layer | $SiO_2$ | about 0.08 μm |
| 4—adhesive adaptive | $Al_2O_3$ | about 0.06 μm |
| 5—barrier | $W_xN$—$AlN_yO_z$ ($0.1 \leq z/y \leq 0.4$) | about 0.02 μm |

In general, in FIG. 4 it is shown an embodiment of the invention with a structure comprised of six thin layers, providing the following sequence starting from a substrate of steel or other material (e.g. receiver tube for thermodynamic installations) not depicted in Figure, on which the multilayer material is applied:

adhesive adaptive layer 4 (thickness comprised between 0.02 and 0.12 μm) to foster growth of a reflecting metallic layer, e.g. of α-phase W (or Mo) having a high IR reflectivity, such layer being of $WN_x$—AlN or $MoN_x$—AlN or $Al_2O_3$ or W+$Al_2O_3$ or Mo+$Al_2O_3$ type;

reflecting metallic layer 2, preferably of W or Mo (thickness of from 0.06 to 0.60 μm) as IR reflector;

barrier layer 5 (thickness of from 0.005 to 0.05 μm) of cermet type, preferably $W_xN$—$AlN_yO_z$ or $Mo_xN$—$Al_yNO_z$;

cermet material layer 1 as selective absorber, preferably of $W_yN$—AlN or $Mo_yN$—AlN type (thickness of from 0.05 to 0.15 μm), wherein the content of metallic component decreases from the substrate towards the antireflection layer;

first antireflection layer 3 (thickness of from 0.02 to 0.15 μm) preferably of AlN type;

second antireflection layer (thickness of from 0.02 to 0.15 μm) of $SiO_2$ or $Al_2O_3$ type.

The present invention has hereto been described with reference to preferred embodiments thereof. It is understood that other embodiments might exist, all falling within the concept of the same invention, as defined by the protective scope of the claims hereinafter.

Any set combination of elements and/or parameters and/or conditions described in the present application has a purely exemplary meaning since, in accordance with the present invention, each individual element, parameter or condition is meant totally individually and independently of any other element, parameter or condition of said combination, therefore extractable from said combination and replaceable in any other combination.

The invention claimed is:
1. An optically selective double-nitride composite material, consisting essentially of a ceramic matrix and a component having a metallic behavior nanodispersed therein, characterized in that:
said ceramic matrix is an aluminum or silicon nitride wherein the ratio between Al or Si and N is substoichiometric and
said component having a metallic behavior is a nitride of $M_yN_z$ type, wherein M is a transition metal and the ratio between M and N is stoichiometric and such that essentially $M_2N$ phase is present.
2. The material according to claim 1, wherein the ceramic matrix is an aluminum nitride $AlN_x$ with x comprised in a range $0.90 \leq x < 1.00$ or x is equal to 0.95 or wherein the ceramic matrix is a silicon nitride $Si_3N_{4-k}$ with $k>0$.

3. The material according to claim 1, wherein said transition metal M is selected from the group consisting of W, Mo, Ti and Zr.

4. The material according to claim 1, wherein said component having a metallic behavior is distributed in the ceramic matrix according to a gradient or according to a step-like pattern and such as to make respectively a graded or multilayer composite material.

5. A spectrally selective multilayer coating material for use in solar installations, comprising at least one layer of composite material (1) according to claim 1.

6. The multilayer coating material according to the claim 5, comprising a further layer of metallic material (2) reflecting in the infrared region of the spectrum, underlying said composite material layer (1), and a further layer of antireflection material (3) antireflective to solar radiation, lying above said composite material layer (1).

7. The multilayer coating material according to claim 6, wherein said layer of metallic material (2) is selected from the group consisting of W, Mo, Ag, Cu and Au.

8. The multilayer coating material according to claim 6, wherein said metallic material (2) is W or Mo having a threefold-type, high-compactness alpha-phase crystalline structure.

9. The multilayer coating material according to claim 6, wherein said antireflection material layer (3) is AlN or $Al_2O_3$ or $SiO_2$.

10. The multilayer coating material according to claim 6, comprising a further adhesive adaptive layer (4) underlying said metallic material layer (2).

11. The multilayer coating material according to claim 10, wherein said adhesive adaptive layer (4) of said metallic material layer (2) comprises one or more elements selected from the group consisting of W, Mo, Ti, Zr, W+AlN, Mo+AlN, Ti+AlN, Zr+AlN, $TiN_x$, $ZrN_x$, AlN, $Al_2O_3$, $W+Al_2O_3$, $Mo+Al_2O_3$, $W_xN$—AlN, and $Mo_xN$—AlN, on condition that the one or more elements are Mo, W, Ti, $Al_2O_3$, and/or $Mo+Al_2O_3$ in case the metallic material layer (2) is Ag or Cu or Au, or that the one or more elements are $W_xN$—AlN, $Mo_xN$-AlN, $Al_2O_3$, $W+Al_2O_3$, and/or $Mo+Al_2O_3$, in case the metallic material layer (2) is alpha-phase W or Mo.

12. The multilayer coating material according to claim 11, wherein the metallic material layer (2) is Ag or Cu or Au and said adhesive adaptive layer (4) is W or Mo with a first layer of alpha crystalline form W (or Mo) and a second layer of beta crystalline form W (or Mo).

13. The multilayer coating material according to claim 6, comprising a further barrier layer (5) of interposition between said metallic material layer (2) and said composite material layer (1) apt to prevent diffusion and/or chemical reaction phenomena between the latter two layers.

14. The multilayer coating material according to claim 6, wherein the composite material layer (1) is graded or multilayer, and wherein the component having a metallic behavior decreases from the innermost interface, between composite layer and metallic layer or between composite layer and barrier layer, to the outermost one between composite layer and antireflection material layer, according to a gradient or step-like pattern.

15. The multilayer coating material according to claim 13, wherein said barrier layer (5) has a thickness comprised in the range of about 0.005-0.05 µm.

16. The multilayer coating material according to claim 13, wherein said barrier layer (5) is a composite material consisting essentially of a ceramic matrix and a component having metallic behavior, of type $W_xN$—$AlN_yO_z$ or $Mo_xN$—$Al_yNO_z$ nanodispersed therein.

17. The multilayer coating material according to claim 16, wherein the z/y ratio of $W_xN$—$AlN_yO_z$ or $Mo_xN$—$Al_yNO_z$ is comprised in the range of about 0.1-0.4 and/or the composite material comprises 30-50% of the component having metallic behavior, $W_xN$ or $Mo_xN$, with respect to ceramic component $AlN_yO_z$.

18. The multilayer coating material according to claim 6, comprising a further second layer of antireflection material (6) lying above the first layer of antireflection material (3).

19. The multilayer coating material according to claim 18, wherein said second antireflection material layer (6) is $SiO_2$ or $Al_2O_3$ and said first antireflection material layer (3) is AlN.

20. The multilayer coating material according to claim 6, wherein said composite material layer (1) has a thickness comprised in the range of about 0.05-0.15 µm, said metallic material layer (2) has a thickness comprised in the range of about 0.06-0.60 µm, said antireflection material layer (3) has a thickness comprised in the range of 0.02-0.15 µm, said adhesive adaptive layer (4) has a thickness comprised in the range of about 0.02-0.12 µm, said barrier layer (5) has a thickness comprised in the range of about 0.005-0.05 µm, and said second antireflection material layer (6) has a thickness comprised in the range of about 0.02-0.15 µm.

21. The multilayer coating material according to claim 6, characterized in that at operating temperatures of about 550° C., absorbance α is higher than 0.95 and emissivity $\epsilon_h$ is lower than 0.14, and in that it is stable up to an operating temperature of 550° C.

22. A process of preparation of the optically selective double-nitride composite material according to claim 1, based on reactive co-sputtering technology under nitrogen-containing atmosphere with a dual metallic target, (i) M and (ii) Al or Si, characterized in that it provides an independent flow of nitrogen for each target (i) and (ii) and it comprises substantially concomitant operations of:

depositing aluminium or silicon nitride $AlN_x$ or $Si_3N_{4-k}$ in a sub-stoichiometric ratio and depositing $M_yN_z$ produced by the M target in a stoichiometric ratio and, specifically, such that essentially the $M_2N$ phase is present.

23. The process of preparation of the optically selective double-nitride composite material according to claim 22, wherein:

said depositing aluminium or silicon nitride $AlN_x$ or $Si_3N_{4-k}$ in a sub-stoichiometric ratio is produced by Al or Si metallic target operating under constant cathode voltage and nitrogen flow kept scarce with respect to the flow required to obtain the material in a stoichiometric ratio and said depositing $M_yN_z$ is produced by M target operating at decreasing cathode power and nitrogen flow and in a ratio such as to obtain said $M_yN_z$ in a stoichiometric ratio and such that essentially the $M_2N$ phase is present; wherein said nitrogen flow at the Al or Si target is monitored and varied through a feedback system so as to keep Al/N ratio in $AlN_x$ or Si/N ratio in $Si_3N_{4-k}$ sub-stoichiometric during the entire process.

24. The process according to claim 22, wherein said feedback system is of PEM (Plasma Emission Monitoring) or CVM (Cathode Voltage Monitoring) type.

25. The process according to claim 22, wherein said nitrogen-containing atmosphere comprises an $Ar+N_2$ mixture.

26. The process according to claim 22, wherein said metallic target M is a transition metal M.

27. The process according to claim 26, wherein said transition metal M is selected from the group consisting of W, Mo, Ti and Zr, preferably W or Mo.

28. The process according to claim 22, wherein x is comprised between 0.90 and less than 1.00, or is equal to 0.95 and k is greater than zero.

29. A process of preparation of a spectrally selective multilayer coating material for use in solar installations according to claim 5, characterized in that it comprises a process of preparation of the optically selective double-nitride composite material.

30. The process according to claim 29, comprising in a time sequence:
a first step of depositing a layer of metallic material (2) reflecting in the infrared region of the spectrum,
a second step of depositing a double-nitride composite material (1), and
a third step of depositing a first antireflection material (3) antireflective to solar radiation.

31. The process according to claim 30, wherein said step of depositing said metallic material layer (2) is carried out so as to obtain a crystalline alpha phase of said threefold-type, high-compactness metallic material.

32. The process according to claim 30, comprising a preliminary step, preceding said first step of depositing a metallic material layer (2), of depositing through sputtering technique a further adhesive adaptive layer (4).

33. The process according to claim 30, comprising the further step of depositing, through reactive co-sputtering technique, a barrier layer (5) interposed between said metallic material layer (2) and said composite material layer (1), apt to prevent diffusion and/or chemical reaction phenomena between the latter two layers.

34. The process according to claim 30, comprising a further step of depositing, through reactive sputtering technique, a further second antireflection material layer (6) lying above the first antireflection material (3).

35. The process according to claim 30, wherein said step of depositing said first antireflection material (3) is carried out through reactive sputtering technique.

36. The process according to claim 30, wherein said step of depositing said metallic material layer (2) is carried out through sputtering technology, operating at high cathode power density comprised between 8 and 18 W/cm$^2$ and/or at low pressure comprised between 0.6 and 6.0 µBar.

37. The process according to claim 30, wherein said step of depositing said metallic material layer (2) or further adhesive adaptive layer (4) comprises further preliminary steps of:
making a vacuum condition (about $5\times10^{-7}$ mbar) in a sputtering operating chamber,
minimizing the $CO_2$ and/or $H_2O$ residues on the surface of a substrate to be coated, and
cleaning and preheating a deposition substrate.

38. The process according to claim 37, wherein said preliminary steps envisage:
an argon plasma treatment of the surface of the substrate by ion beam technique at a cathode voltage comprised in the range of about 2-5 kV and at a pressure comprised in the range of about 5-30 µbar and/or
heating of the substrate at a temperature comprised between about 100 and 300° C. under vacuum with a pressure value comprised in the range of about $5*10^{-7}$-$1*10^{-5}$ mbar.

39. A receiver element of solar installations, characterized in that it comprises a spectrally selective multilayer coating material according to claim 4.

40. The receiver element according to claim 39, comprising a receiver tube apt to contain a heat-carrying fluid.

41. The receiver element according to claim 40, wherein said tube is of steel.

42. A process of coating a receiver element according to claim 39, characterized in that it comprises the process of preparing the spectrally selective multilayer coating material for use in a solar installation.

* * * * *